US011505453B2

(12) United States Patent
Barzen

(10) Patent No.: US 11,505,453 B2
(45) Date of Patent: Nov. 22, 2022

(54) SENSOR WITH A MEMBRANE ELECTRODE, A COUNTERELECTRODE, AND AT LEAST ONE SPRING

(71) Applicant: Infineon Technologies AG, Neubiberg (DE)

(72) Inventor: Stefan Barzen, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 424 days.

(21) Appl. No.: 16/774,810

(22) Filed: Jan. 28, 2020

(65) Prior Publication Data
US 2020/0283290 A1    Sep. 10, 2020

(30) Foreign Application Priority Data

Mar. 8, 2019    (EP) .................................... 19161626

(51) Int. Cl.
*H04R 19/04*    (2006.01)
*B81C 1/00*    (2006.01)
*H04R 7/20*    (2006.01)
*H04R 19/00*    (2006.01)
*H04R 29/00*    (2006.01)

(52) U.S. Cl.
CPC ........... *B81C 1/00158* (2013.01); *H04R 7/20* (2013.01); *H04R 19/005* (2013.01); *H04R 19/04* (2013.01); *H04R 29/004* (2013.01); *H04R 2201/003* (2013.01); *H04R 2231/003* (2013.01)

(58) Field of Classification Search
CPC .... H04R 19/005; H04R 19/016; H04R 19/04; H04R 2201/003; B81B 2201/0257; B81B 2201/0264
See application file for complete search history.

(56) References Cited

U.S. PATENT DOCUMENTS

| | | | |
|---|---|---|---|
| 9,131,319 B2* | 9/2015 | Zoellin ................... | H04R 19/04 |
| 11,197,104 B2* | 12/2021 | Loeppert ............... | H04R 19/04 |
| 11,228,844 B2* | 1/2022 | West ...................... | H04R 19/04 |
| 2014/0291786 A1* | 10/2014 | Zoellin ................... | H04R 19/04 257/416 |
| 2015/0041929 A1* | 2/2015 | Bolognia ................ | B81B 7/007 438/51 |
| 2016/0137486 A1* | 5/2016 | Bharatan .............. | H04R 19/005 257/416 |
| 2016/0373874 A1* | 12/2016 | Guo ......................... | H04R 7/20 |
| 2018/0077499 A1* | 3/2018 | Yoo ...................... | B81C 1/00158 |
| 2018/0152788 A1 | 5/2018 | Perletti et al. | |
| 2018/0152792 A1 | 5/2018 | Hoekstra et al. | |
| 2021/0037320 A1* | 2/2021 | Chen ....................... | H04R 7/16 |

FOREIGN PATENT DOCUMENTS

WO    2013105859 A2    7/2013

* cited by examiner

*Primary Examiner* — Ryan Robinson
(74) *Attorney, Agent, or Firm* — Slater Matsil, LLP

(57) ABSTRACT

A sensor includes a membrane electrode, a counter-electrode, and at least one spring. The sensor can include a structure; a membrane electrode, which is deformable as a consequence of pressure and which is in contact with the structure; a counter-electrode mechanically connected to the structure and separated from the membrane electrode by a gap; and at least one spring mechanically connected to the membrane electrode and the counter-electrode, so as to exert an elastic force between the membrane electrode and the counter-electrode.

18 Claims, 19 Drawing Sheets

SENSOR WITH A MEMBRANE ELECTRODE, A COUNTERELECTRODE, AND AT LEAST ONE SPRING

This application claims the benefit of European Patent Application No. 19161626.7, filed on Mar. 8, 2019, which application is hereby incorporated herein by reference.

TECHNICAL FIELD

The present document relates to a sensor (e.g., a pressure sensor and/or an acoustic sensor, e.g., for a microphone) having a membrane electrode, a counter-electrode, and at least one spring interposed between the membrane electrode and the counter-electrode.

The document also relates to a method for manufacturing a sensor such as the sensor above.

BACKGROUND

A pressure sensor, such as an acoustic sensor, may comprise at least two electrodes (e.g., at least one membrane electrode and at least one counter-electrode). For example, a membrane electrode may be deformable, as a consequence, of the pressure (e.g., caused by sound). A counter-electrode may be non-deformable and fixed to a fixed structure. The membrane electrode may be connected to a fixed structure of the sensor in correspondence of the membrane rim.

The membrane electrode may be fabricated so as to present a tensile stress, e.g., to counterbalance the attractive electrostatic forces between the membrane electrode and the counter-electrode.

By virtue of the deformation caused by the pressure, high concentrations of stress may be defined in correspondence of the membrane rim. Accordingly, robustness of the sensors is in general reduced.

Due to the assembly processes, thermal expansion of different package materials and aging of the materials package cause additional stress between the membrane electrode and the counter-electrode. This additional stress changes the compliance of the membrane, reducing, for example, the sensitivity. This leads to significant yield loss.

Since the rim of the membrane electrode is fixed to the structure, large areas of the membrane are limited in their movement. Hence, the overall signal amplitude is reduced. Therefore, the chip delivers limited signal and/or the signal to noise ratio (SNR) is reduced. In general, the sensor needs to be designed larger than necessary, hence increasing costs to reach satisfactory signal and SNR value.

Moreover, tolerances during manufacturing cause the membrane electrode to have non-perfect positioning. Therefore, it is often necessary to perform a calibration to adapt the particular position of the membrane with respect to the structure. Therefore, it is difficult to achieve the result of different sensors, which are nominally identical, to operate exactly at the same sensitivity, without calibration. Calibration, however, implies complications both in software and in hardware.

Further, the stress on the membrane also depends on the external temperature. Therefore, it is difficult to achieve a sensor which is always performing under all climatic conditions.

The limited mechanical robustness can lead to field failures and requires additional measures, limitations and costs. Thicker membranes need therefore to be used.

It is therefore intended to find out techniques which reduce at least in part impairments as those discussed above.

SUMMARY

In accordance with an example, a sensor is provided comprising a structure, a membrane electrode, which is deformable as a consequence of pressure and which is in contact with the structure, a counter-electrode mechanically connected to the structure and separated from the membrane electrode by a gap, and at least one spring that is between the membrane electrode and the counter-electrode so as to exert an elastic force between the membrane electrode and the counter-electrode.

In accordance with an aspect, the sensor may comprise a flexible membrane connection mechanically connecting the membrane electrode to the structure.

In accordance with an example there is provided a method for manufacturing a semiconductor pressure-sensor and/or acoustic sensor, comprising:

preparing a first element on a substrate, wherein the first element is chosen between a membrane electrode and a counter-electrode;

preparing at least one spring element to abut on the first element;

preparing a second element, so that the at least one spring element abuts on the second element and is elastically connected to the first element and the second element, wherein the second element is a counter-electrode or a membrane electrode, wherein the second element is chosen between the counter-electrode and the membrane electrode which is not chosen for the first element.

DETAILED DESCRIPTION OF ILLUSTRATIVE EMBODIMENTS

Figure 1:
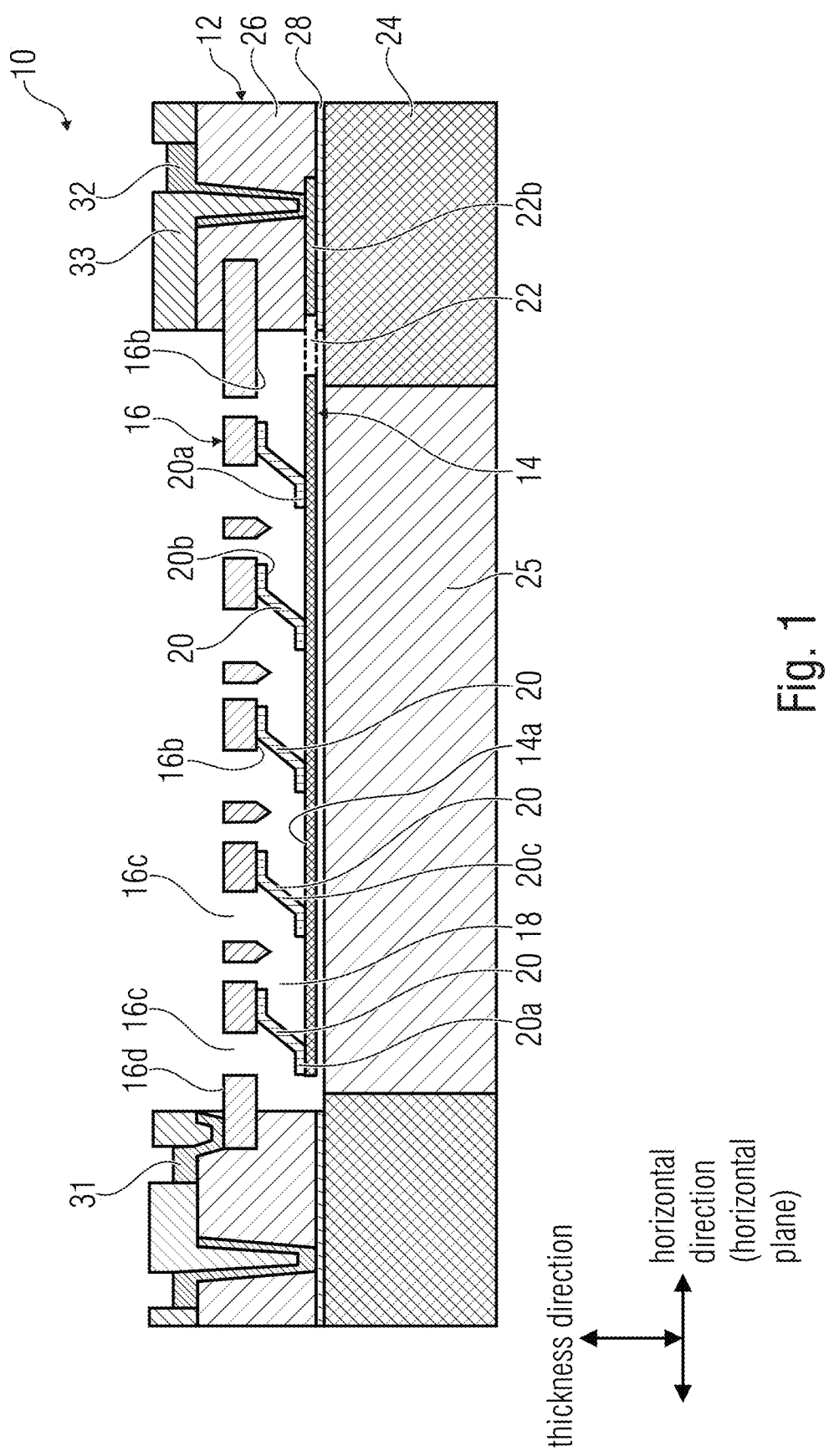
FIGS. 1 and 2 show sensors according to examples.

FIG. 1 shows a sensor 10 according to examples. The sensor 10 may be a pressure sensor. The pressure sensor 10 may be an acoustic sensor (e.g., for a microphone) or a pressure sensor (e.g., to measure external pressure, such as atmospheric pressure). The sensor 10 may be a semiconductor device. The sensor 10 may be a microelectromechanical system (MEMS). The sensor 10 may be an embedded device. The sensor 10 may be an on-chip device. The sensor 10 may be or may be enclosed in a package. The sensor 10 may comprise a structure 12. The structure 12 may be fixed. The structure 12 may comprise (or be contained in) a chip and/or a package.

The sensor 10 may operate as a capacitor with two electrodes at a variable distance (gap), so as to have variable capacitance. The capacitance may vary in function of the distance between the electrodes. In general terms, the higher the distance, the smaller the capacitance, and vice versa. An inverse proportionality between the distance between the electrodes and the capacitance is in general implied.

The sensor 10 may comprise a membrane electrode 14 (e.g., in conductive material). The membrane electrode 14 may be flexible (e.g., in flexible and/or elastic material). The membrane electrode 14 may be deformed as a consequence of pressure (e.g., pressure vibrations, e.g., sound). The membrane electrode 14 may be in contact with the structure 12. E.g., the membrane electrode 14 may be cantilevered to the structure 12. The membrane electrode 14 may be non-rigidly fixed to the structure 12 (e.g., stress-free membrane). The membrane electrode 14 may be suspended, e.g., by springs or other elastic elements, such as a flexible membrane connection. The membrane electrode 14 may present a first surface 14a (which may be an exposed surface) and a second surface 14d (which may be a non-exposed surface).

The sensor 10 may comprise a counter-electrode 16 (e.g., in conductive material). The counter-electrode 16 may be in rigid material. The counter-electrode 16 may be a backplate. The counter-electrode 16 may be mechanically connected to (e.g., fixed to and/or suspended by) to the structure 12. The counter-electrode 16 may present a first surface 16b (which may be a non-exposed surface) and a second surface 16d (which may be an exposed surface).

The counter-electrode 16 may be understood as operating with the membrane electrode 14 to form a capacitor. The counter-electrode 16 may be separated from the membrane electrode 14 by a gap 18.

The counter-electrode 16 may comprise e holes 16c. The holes 16c may permit, inter alia, a fluid communication, through the counter-electrode 16, between the outside and at least one surface 14a of the membrane electrode 14.

The counter-electrode 16, together with the membrane electrode 14, may operate as a capacitor with variable capacitance. The gap 18 may be an air gap (other fluids may be used for different environments; e.g., in subaqueous environments the gap 18 may be filled with water). The gap 18 may operate as dielectric in the capacitor, which is in this case variable. The obtained capacitor has variable capacitance on the basis of the variable gap 18, which may in turn vary, for example, on the basis of the pressure. The capacitor with variable capacitance may also be used as an audio/acoustic/sound sensor (e.g., to operate as a microphone): for example, the acoustic vibrations may be measured on the basis of the modifications of the gap 18.

The sensor 10 may extend according to a thickness direction (vertical in FIG. 1) and a horizontal plane, orthogonal to the thickness direction (in FIG. 1 the horizontal plane extends along a horizontal direction and a direction entering in and exiting from the paper). The sensor 10 may extend more in the horizontal plane than in the thickness direction. The membrane electrode 14 and the counter-electrode 16 may extend principally planarly, e.g. in the horizontal plane. The gap 18 may have a volume which mainly extends horizontally, but the height of the gap 18 may vary at least along the thickness direction. The deformation of the membrane electrode 14 may be seen as a deformation in the thickness direction, e.g., in which the height of the gap 18 is reduced and/or increased according to the pressure (and the capacitance of the capacitor changes accordingly). As seen in the thickness direction, the membrane electrode 14 and the counter-electrode 16 may be at least partially superposed with each other.

The membrane electrode 14 may have a surface 14a which may face a surface 10 of the counter-electrode 16, the surfaces 14a and 16b being separated by the gap 18. The surface 10 may be an internal (non-exposed) surface. While in FIG. 1 the membrane electrode 14 is more internal than the counter-electrode 16, in other examples, their relative positions of the surfaces may be reversed.

It has been noted that it is beneficial for the sensor 10 to present at least one spring 20 interposed between the membrane electrode 14 and the counter-electrode 16 (e.g., in the gap 18). The at least one spring 20 may be mechanically connected to both the membrane electrode 14 and the counter-electrode 16. The at least one spring 20 may at least partially sustain the membrane electrode 14. The at least one spring 20 and the membrane electrode 14 may be fixed and/or adhere to each other. The at least one spring 20 and the counter-electrode 16 may be fixed and/or adhere to each other. In some cases, the counter-electrode 16 may at least partially sustain the membrane electrode 14 through the at least one spring 20. The at least one spring 20 may be an elastic member which exerts an elastic force between the membrane electrode 14 and the counter-electrode 16. In particular by virtue of the use of the at least one spring 20, it is possible to reduce or avoid tensile stress at the rim of the membrane electrode 14.

The structure 12 may comprise, for example, a substrate 24, which may comprise a backside etch layer 25. The structure 12 may comprise a covering part 26 (e.g., in covering oxide, such as TEOS, tetraethyl orthosilicate). Between the covering part 26 and the substrate 24, a stop layer 28 (e.g., stop layer in stop oxide material) may be provided in some regions of the substrate 24.

As can be seen from FIG. 1, the structure 12 may comprise a membrane electrode terminal 32, electrically connected to the membrane electrode 14 (e.g., through a conductive connection obtained in a conduct hole). The structure 12 may comprise a counter-electrode terminal 31, electrically connected to the counter-electrode 16 (e.g., through another conductive connection obtained in a conduct hole). The terminals 31 and 32 may be electrically connected to internal or external circuitry and/or to an external device and other components (e.g., through terminal paths and/or through external pads). A passivation layer 33 may be provided to be in contact between the metal layers forming the terminals 31 and/or 32 and/or the covering part 26.

The at least one spring 20 may comprise a membrane-side foot 20a abutting on the membrane electrode 14 (e.g., to the surface 14a) and/or a counter-electrode-side foot 10b abutting to the counter-electrode 16 (e.g., to the surface 16b). At least one of the feet 20a and 10b may be fixed and/or adhered to the respective membrane electrode 14 or counter-electrode 16. A main portion 20c of the spring 20 may be mechanically connected between the membrane-side foot 20a and the counter-electrode-side foot 10b.

In examples, a plurality of springs 20 may be placed between the membrane electrode 14 and the counter-electrode 16. In examples, a plurality of springs 20 are disposed in an array and/or a matrix, e.g., at regular distances from each other. In examples, the plurality of springs 20 are disposed so as to have the same spring constant or a spring constant which varies of maximum 1% or 5% between different springs 20. The main portion 20c may provide elasticity. The main portion 20c of the spring 20 may extend prevalently in an oblique direction. Different springs 20 may have the same or similar obliquity angle within a 1% or 5% tolerance. The obliquity may provide elasticity. The obliquity may affect the spring constant. The length of the main portion 20c of the spring 20 is in general less important than the obliquity angle.

A flexible membrane connection 22 may be provided to mechanically connect (e.g., sustain and/or support and/or fix) the membrane electrode 14 to the structure 12. The flexible membrane connection 22 may be made to elastically deform (e.g., in the thickness direction), at least partially as a consequence of deflection of the membrane electrode 14 (e.g., by virtue of pressure). The flexible membrane connection 22 may comprise a lateral spring. The flexible membrane connection 22 may permit electrical conduction. The flexible membrane connection 22 may be obtained in the same material of the membrane electrode 14. The flexible membrane connection 22 may be obtained by modifying (e.g., by cutting or making a hole on) a part of the membrane electrode 14.

Figure 2:
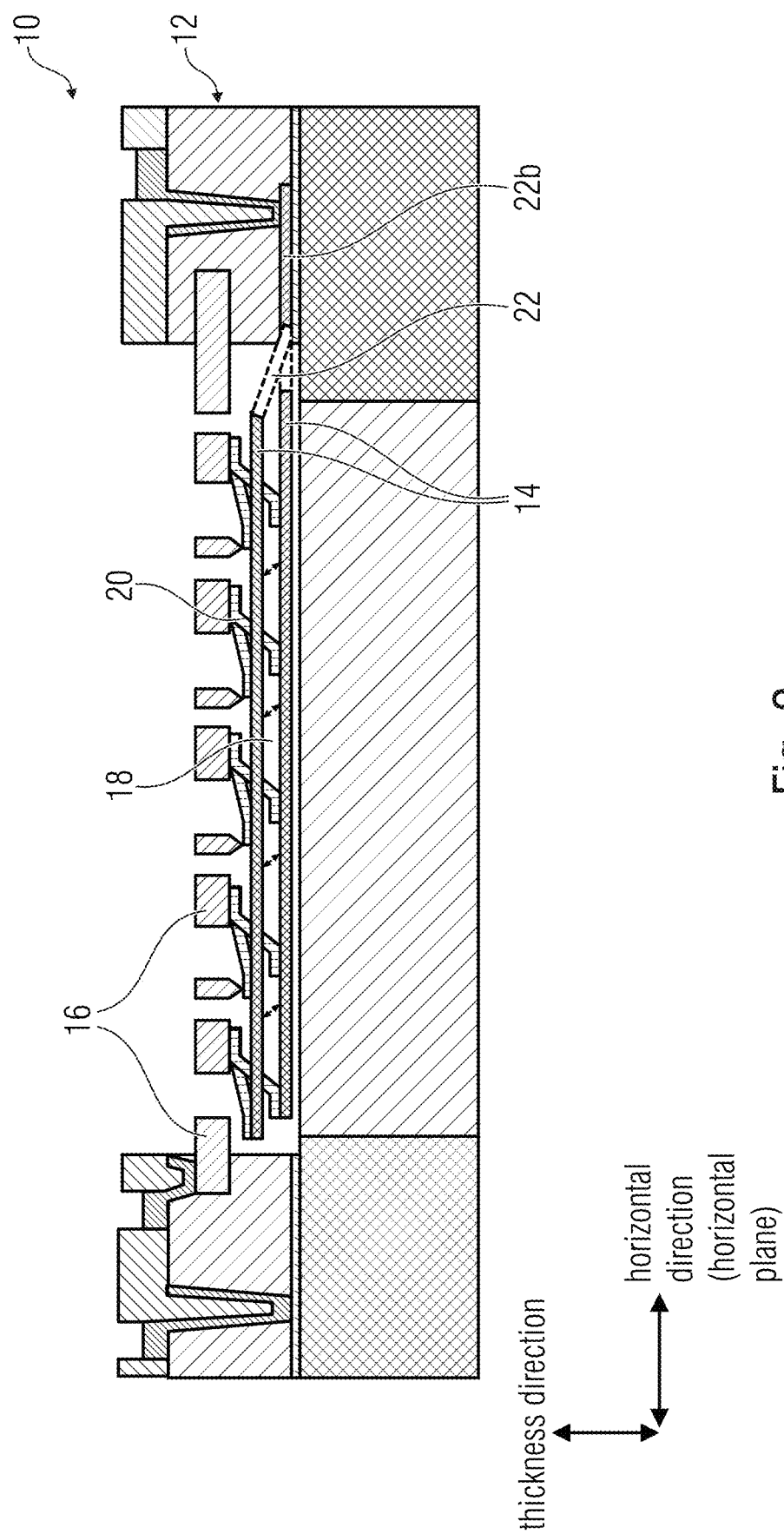

As shown by FIG. 2, the membrane electrode 14 may, in operation, be deformed between a first position (gap 18 at a first height in the thickness direction as a consequence of a first pressure) and a second position (gap 18 at a second height in the thickness direction as a consequence of a second pressure), so as to change between a first capacitance and a second capacitance. Plurality of other positions (e.g., intermediate positions) may be obtained, for example, as a consequence of a correspondent plurality of pressures, and leading to a plurality of correspondent capacitances. As can be seen from FIG. 2, a more uniform deflection (homogeneous membrane deflection) is obtained, in the sense that the gap 18 is tendentially uniform along the horizontal plane, also by virtue of the use of the at least one spring 20 and/or by its combined effect with the elastic deformation of the flexible membrane connection 22.

Figure 3:
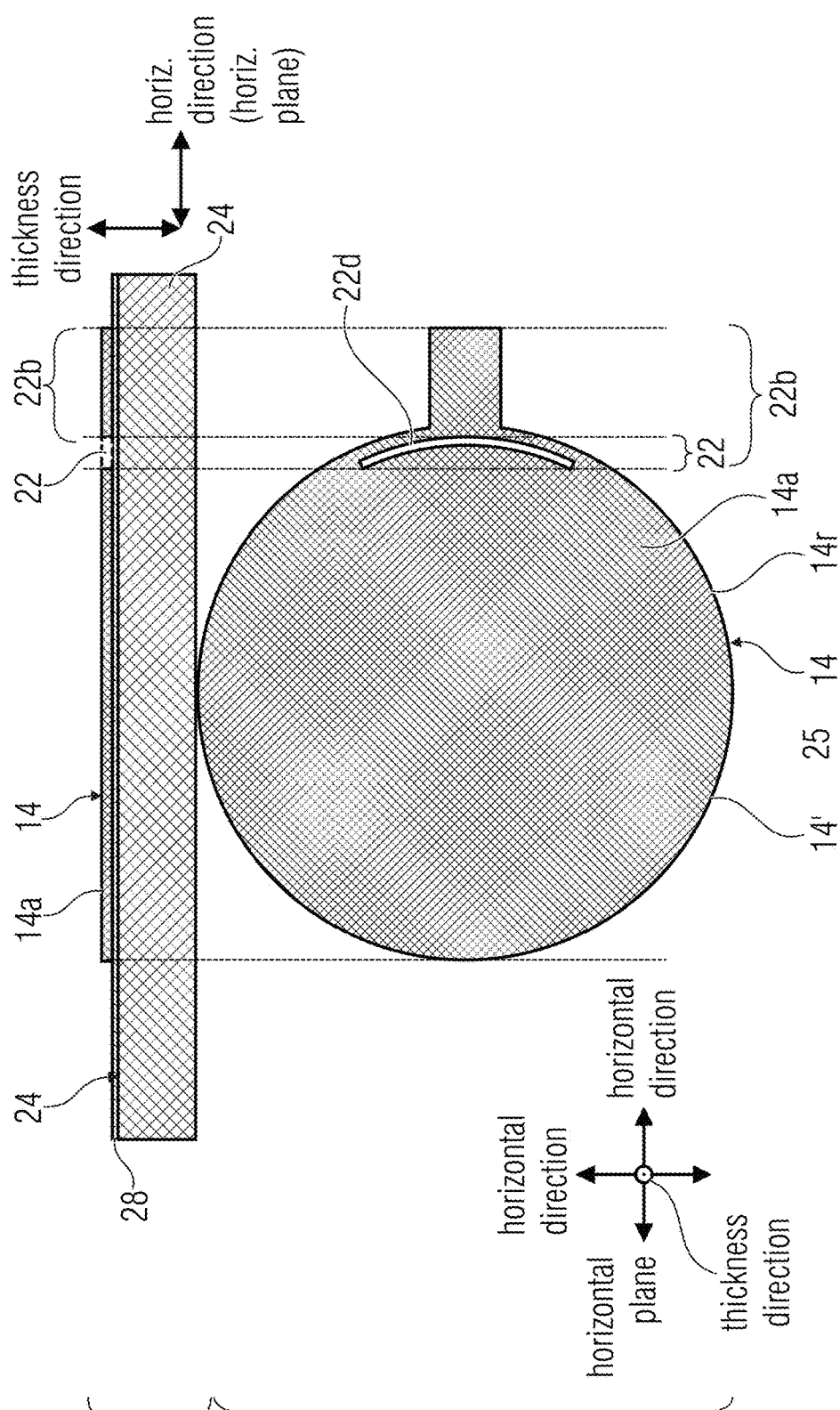
FIG. 3 shows an element according to an example.
Figure 10:
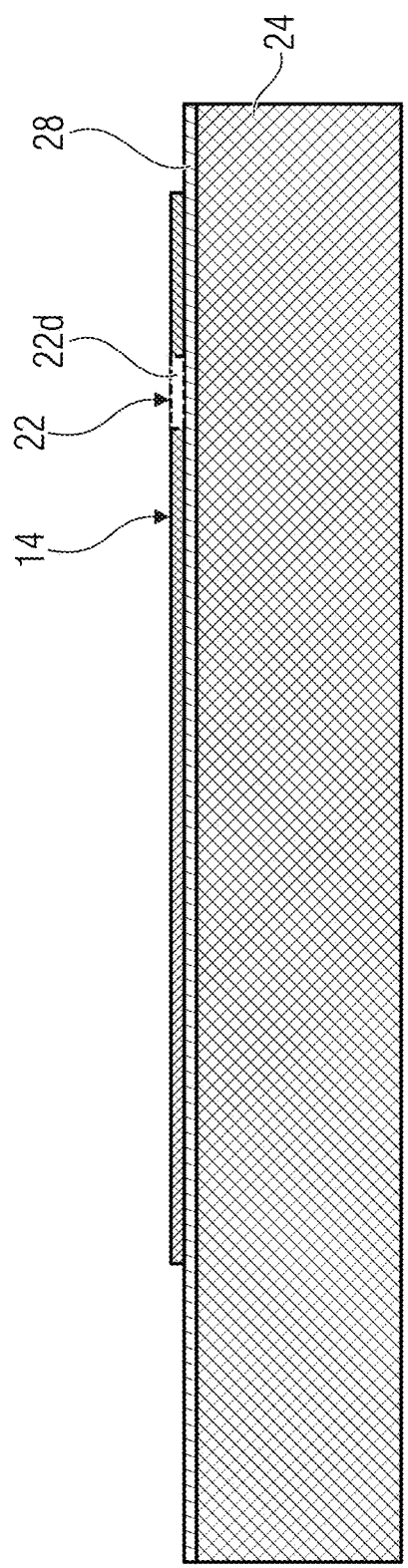
FIGS. 10-17 show intermediate steps according to methods.
Figure 11:
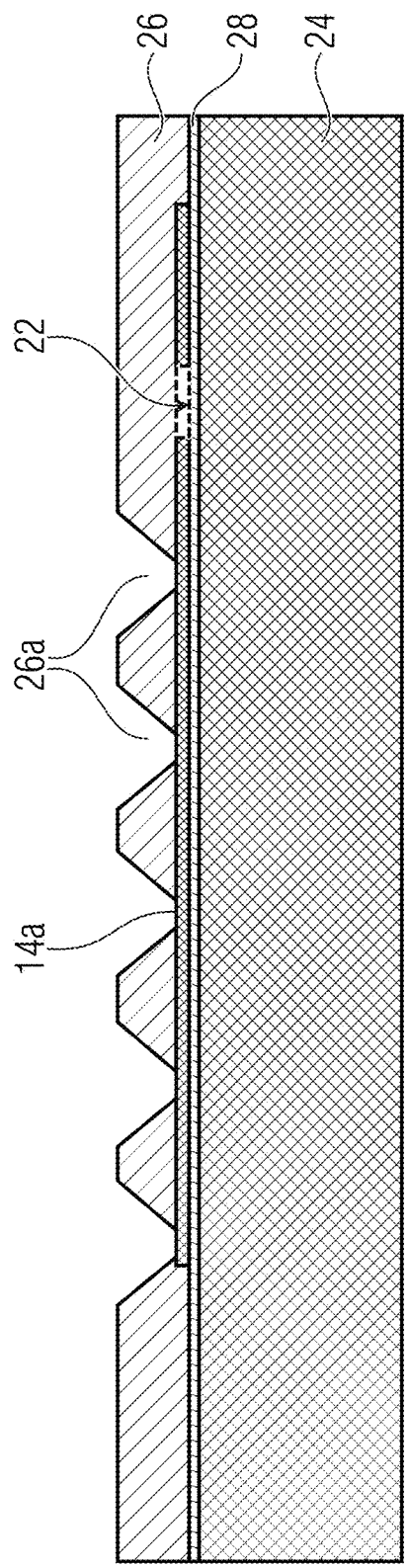

FIG. 3 shows an example of the membrane electrode 14 as shown both from a direction perpendicular to the thickness direction (FIG. 3a) and from a direction perpendicular to the horizontal plane (FIG. 3b). It is noted that FIG. 3a is equivalent to FIG. 10 and refers to an intermediate passage for manufacturing the sensor of FIG. 1. FIG. 3b, instead, refers to the final configuration of the membrane electrode 14.

The membrane electrode 14 may comprise a main portion 14' which provides the surface 14a and/or which is used as an electrode of the capacitor. The flexible membrane connection 22 may be obtained by a cut or hole 22d in the membrane electrode 14 (e.g., an arcuate portion, e.g., concentric with the rim 14r of the membrane electrode 14), e.g. in correspondence with the portion 22b of the membrane electrode 14, which is in contact to the structure 12 (e.g., the portion 22b may be sandwiched in the structure 12, e.g. between the covering part 26 and the substrate or the stop layer 28 of the substrate 24; the portion 22b may be cantilevered to the structure 12). The cut or hole 22d may be closer to the rim 14r of the membrane electrode 14 than to the center of the membrane electrode 14. The cut or hole 22d may be closer to the portion 22b of the membrane electrode 14 than to the center of the membrane electrode 14. In this example, the cut or hole 22d forming the flexible membrane connection 22 may be arcuate (e.g., arched) and/or cut concentrically to a circumference of the main part of the membrane electrode 14. The cut or hole 22d may be a through cut or through hole, and may traverse the whole thickness of the membrane electrode in the thickness direction.

When the membrane electrode 14 is deformed (e.g., by virtue of the pressure), the flexible membrane connection 22 may deform correspondingly: for example, the cut or hole 22d in the membrane electrode 14 may permit a more uniform movement of the main portion 14' with respect to the portion 22b, so as to maintain a prevalently uniform height in the gap 18 along the horizontal plane (see FIG. 2).

The stop layer 28 may be provided between the membrane electrode 14 (and/or the membrane connection 22.

In the example of FIG. 1, the membrane electrode 14 is cantilevered to the structure 12. The at least one spring 20 may (e.g., in combination with the flexible membrane connection 22) permit to maintain uniform the height of the gap 18 in the horizontal plane. As can be seen by comparing FIGS. 1 and 3, the portion 22b of the membrane electrode 14 may be directly connected to and/or in contact with the structure 12, while the majority or the totality of the rim 14r of the membrane electrode 14 is not mechanically connected to the structure 22. The at least one spring 20 may still be in contact with both the membrane electrode 14 and the counter-electrode 16.

The example of FIG. 3 may allow a movement both in a horizontal direction (e.g., from right to left in FIG. 2) and in the thickness direction (e.g., vertical in FIG. 2). An effective electrical connection is achieved. As can be seen from FIG. 3, the cut or hole 22d may be a partial cut or hole, and therefore the membrane electrode 14 can find an electric path toward the membrane electrode terminal 32 (e.g., through the portion 22b connected to the structure 12).

Figure 4:
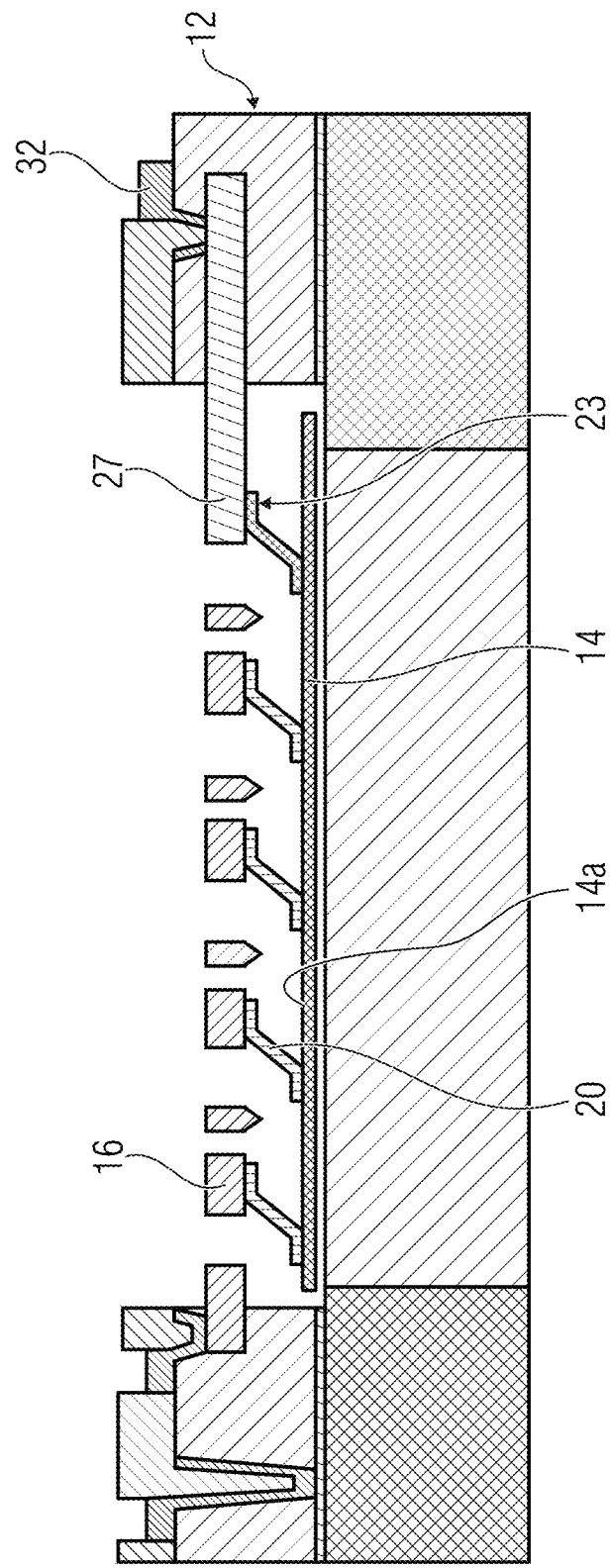
FIGS. 4 and 5 show sensors according to examples.

Additionally, or alternatively, the flexible membrane connection 22 may comprise a spring 23 exerting an elastic force between the membrane electrode 14 and the structure 12 (FIG. 4). For example, the structure 12 may comprise a segmented part 27 the at least one spring 20 (which may be or not be a part of the counter-electrode 16). The membrane electrode 14 may be elastically suspended to (or sustained or fixed by) the spring 23. The spring 23 may have at least one or some or all of the features of the at least one spring 20 discussed above (these features are therefore not repeated here). The spring 23 may elastically deform at least as a partial consequence of the movement of the membrane electrode 14. When the spring 23 is provided, the cut or hole shown in FIG. 3 may be avoided. The spring 23 may permit the connection of the membrane electrode 14 with the membrane electrode terminal 32 through the segmented part 27. The spring 23 may be in electrically conductive material. Instead of one single spring 23, multiple springs may be used.

A hybrid solution may also be obtained: the membrane electrode 14 may be partially suspended and may be partially supported by the structure 12 with low tensile stress.

Figure 5:
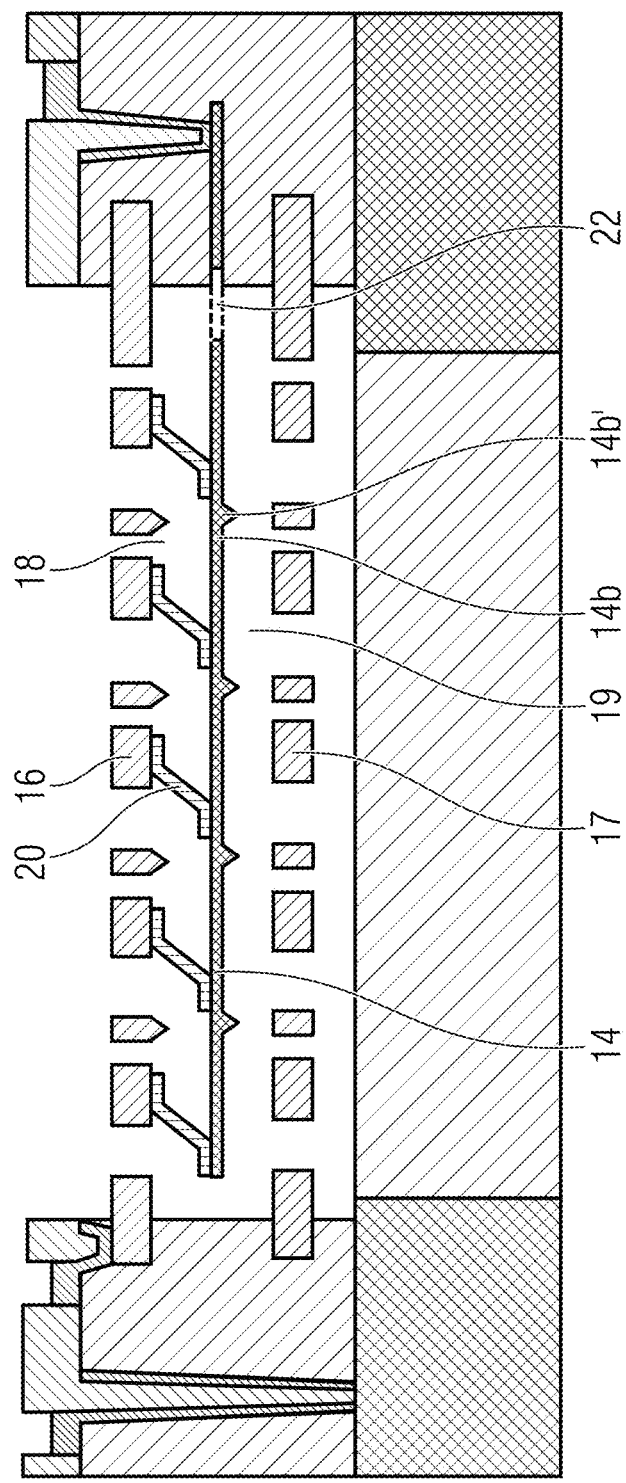

FIG. 5 shows a variant, in which the membrane electrode 14 is interposed between a first and second counter-electrodes 16 and 17 and is spaced from the first and second counter-electrodes 16 and 17 by a first and a second gaps 18 and 19, respectively. The at least one spring 20 may be between the membrane electrode 14 with the first counter-electrode 16 (e.g., the most exposed or external one), while no springs are provided between the membrane electrode 14 and the second counter-electrode 17 (e.g., the more internal or non-exposed one). In some examples, springs 20 may be provided to connect the membrane electrode 14 with both, the first and second counter-electrodes 16 and 17. In the latter case, the membrane electrode 14 and the first and second counter-electrodes 16 and 17 may operate as two distinguished capacitors (e.g., two capacitors in series) with variable capacitances on the basis of the pressure.

Figure 6:
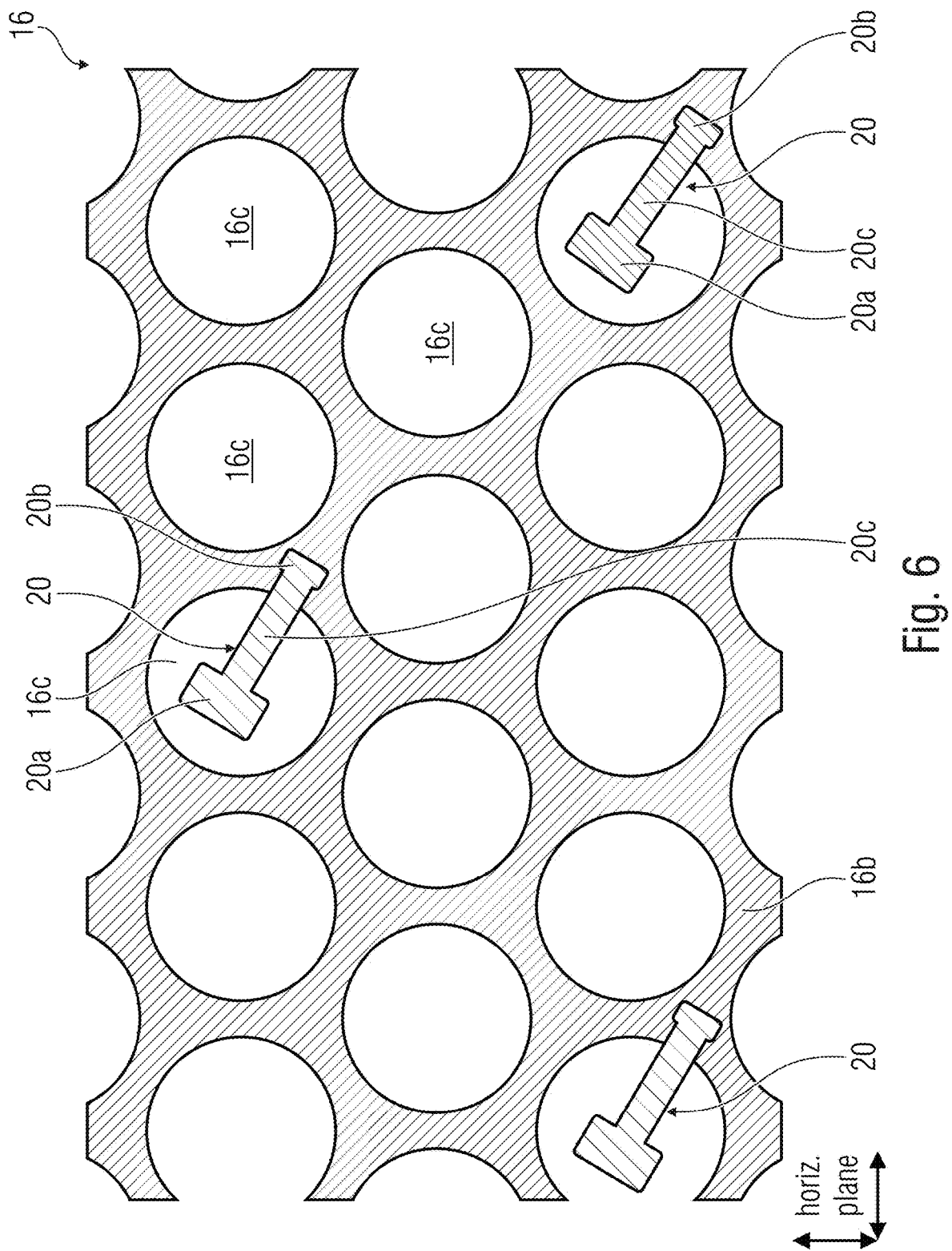
FIGS. 6-9 show elements according to examples.
Figure 7:
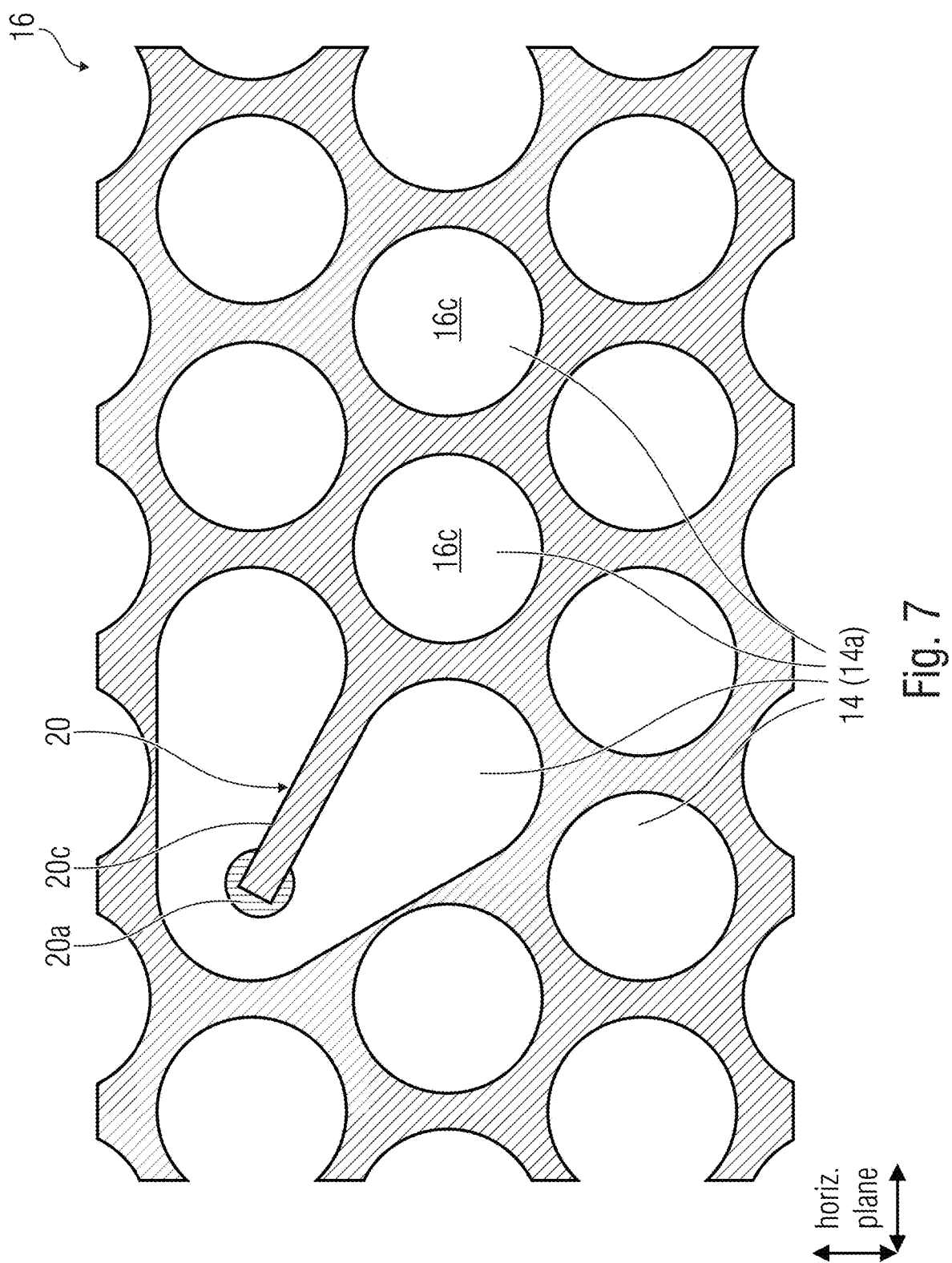
Figure 8:
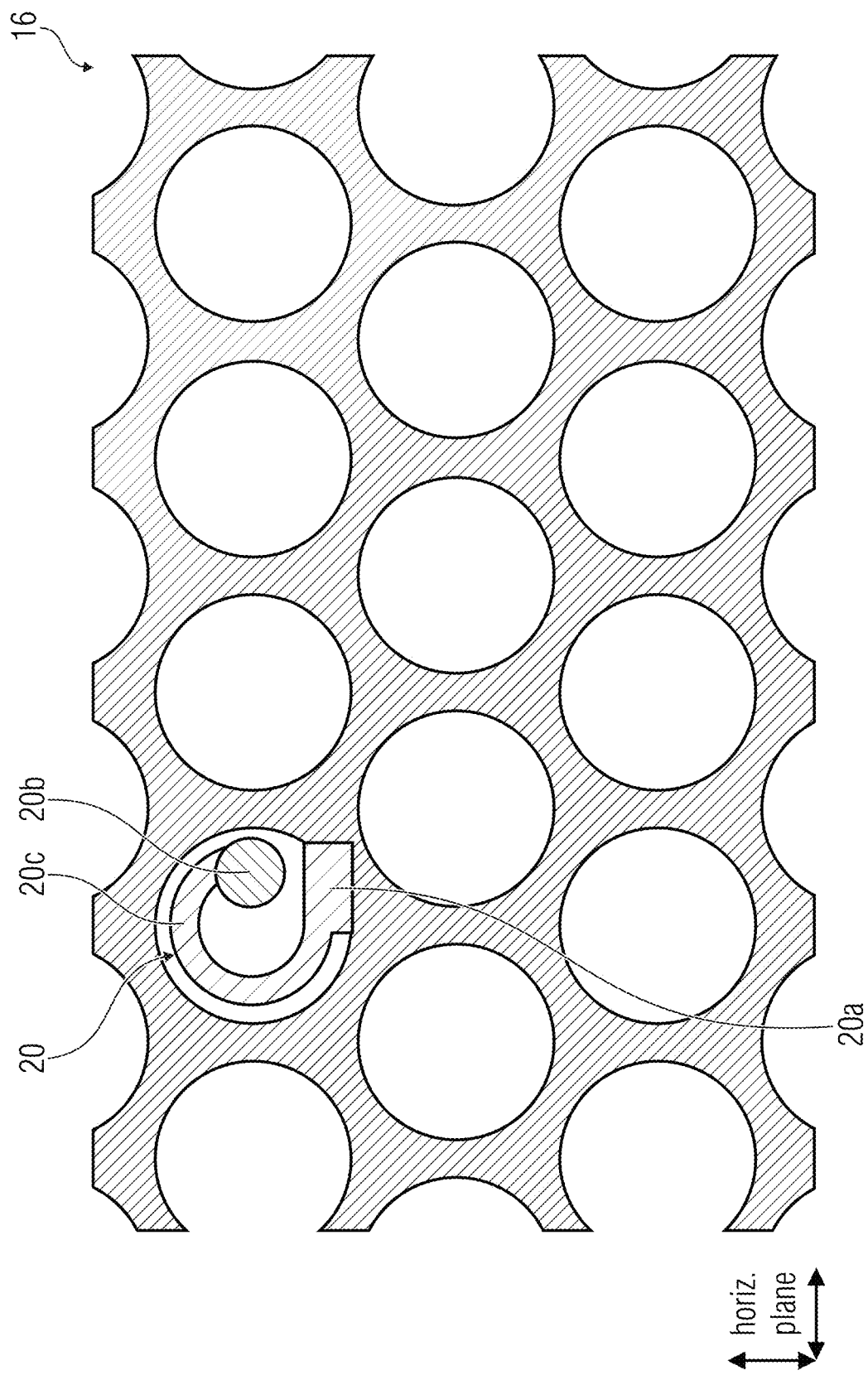

FIGS. 6-8 show, in the horizontal plane, examples of elements of springs 20 and counter-electrodes 16.

In FIG. 6, the membrane-side foot 20a (which may abut to the surface 14a of the membrane electrode 14) of the spring 20 abuts on the membrane electrode 14 (not shown). The counter-electrode-side foot 10b of the spring 20 abuts on the surface 10 of the counter-electrode 16. As may be understood by comparing FIG. 6 with FIGS. 1, 2, 4, and 5, while the feet 20a and 10b may prevalently extend in a horizontal direction, the main portion 20c of the spring 20 may extend prevalently in an oblique direction. It has been noted that the length of the main portion 20c of the at least one spring 20 is, in general, not important.

The at least one spring 20 may be in a conductive material (e.g., doped semiconductor material or metal material) which may be the same as the material of the counter-electrode 16. In examples, the at least one spring 20 and the counter-electrode 16 may be integral with each other.

In order to avoid short-circuits between the membrane electrode 14 and the counter-electrode 16 via the at least one spring 20, the membrane electrode 14 may present (e.g., in some portions of the surface, at least in the surface 14a), non-conductive islands. Accordingly, even if the at least one spring 20 may be in a metal or in a conductive material, no short-circuit is caused between the counter-electrode 16 and the membrane electrode 14. A typical material for the at least one spring 20 may be polysilicon or SiNi. In addition or in alternative to the use of the island(s), the at least one spring 20 may be externally layered with an electrically insulating layer. In other variants, the at least one spring 20 may be in electrically insulating material.

FIG. 7 shows an example in which, with respect to FIG. 1, the counter-electrode 16 is shown from above (i.e., different from FIG. 6). The at least one spring 20 is in this example integral with and in the same material of the counter-electrode 16. The membrane-side foot 20a may abut on the membrane electrode 14 (i.e., the exposed surface 14a of the membrane electrode 14).

FIG. 8 shows another example in which with respect to FIG. 1, the counter-electrode 16 is seen from below, the elements 24, 25 and 14 not being shown. As can be seen, the main portion 20c of the at least one spring 20 in this case has the shape of a spiral, hence increasing the elastic properties of the at least one spring 20. Other shapes may be chosen.

Figure 9:
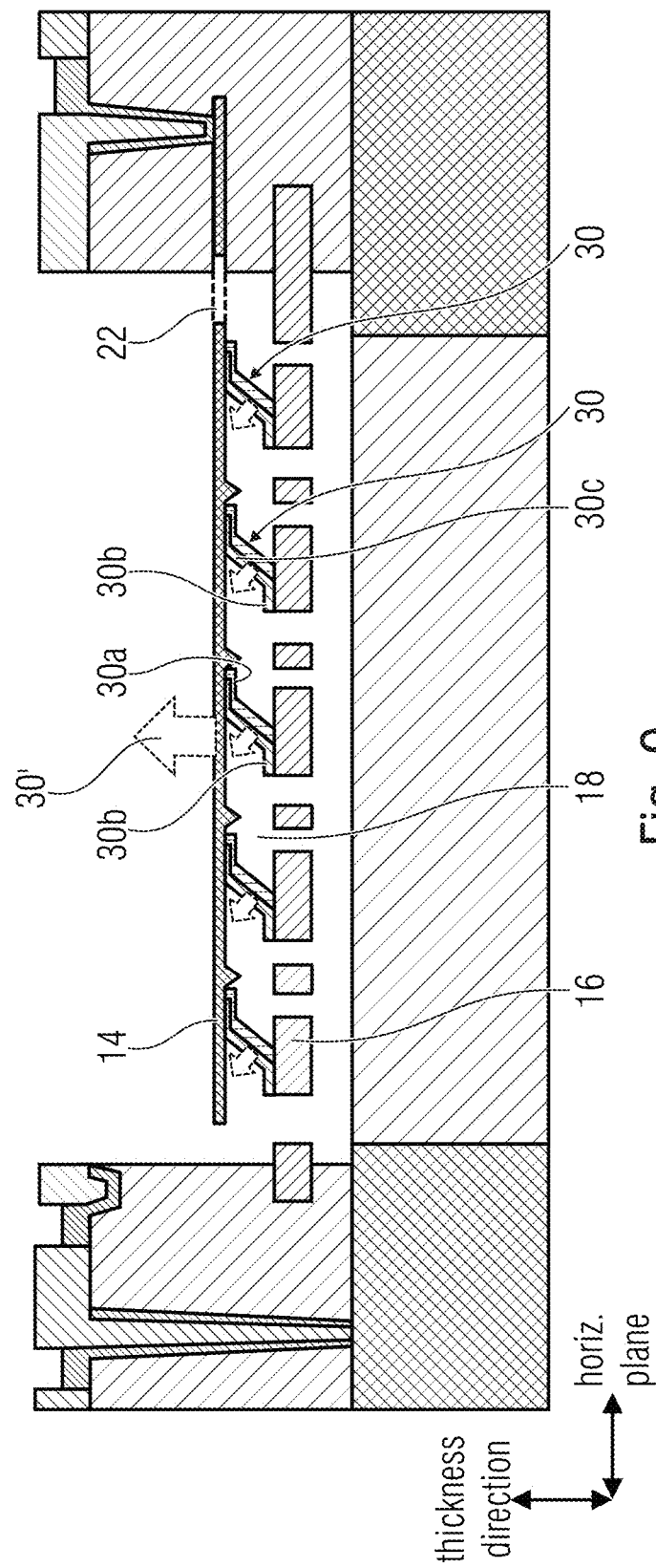

FIG. 9 shows an example in which the at least one spring is at least one bimorph spring 30. The at least one bimorph spring 30 may be a spring which, when manufactured, moves the membrane electrode 14 (in the thickness direction, as indicated by the arrow 30') towards a position more distant from the counter-electrode 16, i.e. naturally increasing the height of the gap 18. The at least one bimorph spring 30 may be such that the main portion 30c between the membrane-side foot 30b (abutting to the counter-electrode 16) and the membrane-side foot 30a (abutting to the membrane electrode 14) is formed by a couple of intermediate portions (e.g., of different materials) disposed to be adjacent to each other.

The range of movement can be significantly increased using the bimorph springs 30 which bend away from the counter-electrode 16 after the removal of the sacrificial layer. Accordingly, a limit (typical for the prior art) in reaching a high sound pressure level is overcome.

In FIG. 9, the relative position between the membrane electrode 14 and the counter-electrode 16 is in this example reversed with respect to the example of FIG. 1. This reversal may be carried out for any of the examples above or below.

Figure 18:
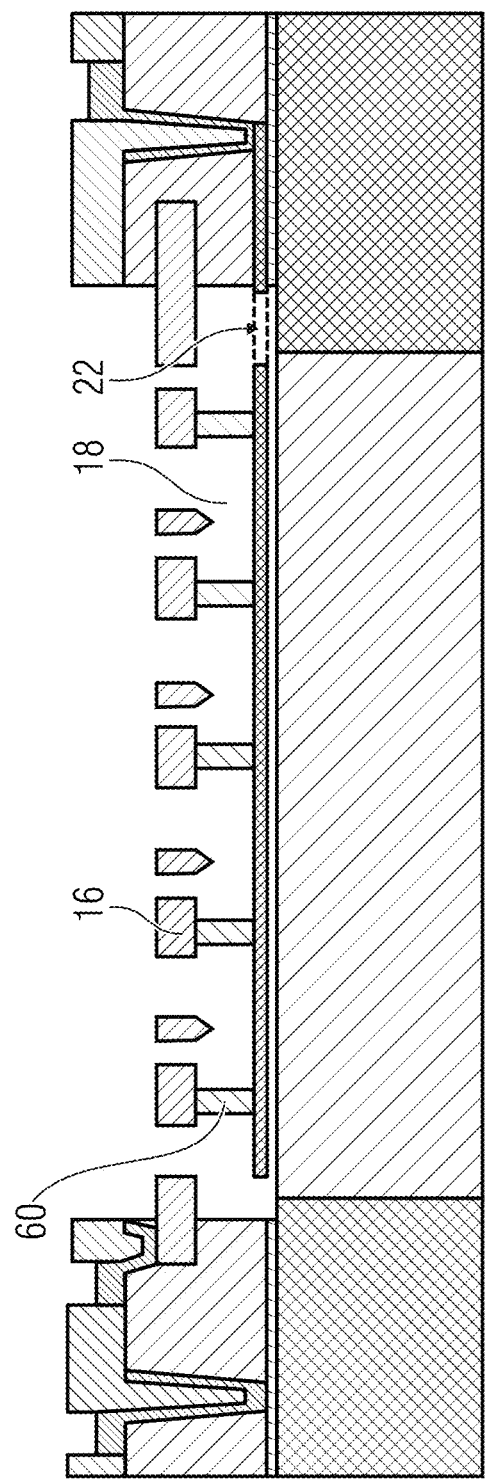
FIG. 18 shows a sensor according to an example.

FIG. 18 shows another example of a sensor 10 with at least one (e.g., a plurality of) vertical spring(s) 60 conformed as vertical springs, elongated along the thickness direction through the gap 18. The at least one vertical spring 60 may be made in flexible material. Here, the at least one vertical spring 60 may be obtained by a vertical connection between membrane electrode 14 and the counter-electrode 16.

In general, examples above present several important advantages. The compliance of the membrane electrode 14 is in general not defined by tensile stress and is in general not influenced by external forces. Instead, the compliance of the membrane electrode 14 is in general determined by the design and the bending stiffness of the material used for manufacturing the at least one spring 20, 30, 60. Importantly, the bending stiffness of the material is a parameter which is particularly stable: the properties of the sensor will not easily change in time and nominally identical sensors will have the same or a similar behavior.

A higher stability and yield can be reached for the production of the sensor. A calibration function can often be avoided, as it is ensured that the actual parameters of different sensors with the same nominal parameters do not vary too much.

The system costs can also be reduced. The counter-electrode(s) 18 and/or 19 may be designed with thinner layers and a larger acoustical transparency, hence reducing noise contribution and leading to higher SNR.

Further, reliability is increased. In case of intrusion of a particle, the local compliance of the membrane electrode 14 can be modified, but the overall sensitivity change is limited, at least by virtue of the elastic action exerted by the at least one spring 20, 30, or 60.

In several examples, at least one surface (e.g., the surface 14a facing the counter-electrode 16 but spaced therefrom by the at least one spring) of the membrane electrode 14 and/or of the counter-electrode 16 (e.g., the surface 10 facing the membrane electrode 14 but spaced therefrom by the at least one spring) may be a bump-free surface: bumps or other protuberances may be non-completely necessary. This is because the at least one spring 20, 30, or 60 may maintain a safe distance between the membrane electrode 14 and the counter-electrode 16. Therefore, it will be improbable that, in operation, the membrane electrode 14 and the counter-electrode 16 will be in contact with each other, remaining attached to each other by virtue of unintended electrostatic attraction. Notwithstanding, a small number of bumps may be provided to increase safety, and to maintain at least a little gap between the membrane electrode 14 and the counter-electrode 16 when the membrane electrode 14 touches the counter-electrode 16.

In the example of FIG. 5, while the surface 14a, spaced from the first counter-electrode 16 by the at least one spring 20, is bump-free, the surface 14b presents bumps 14b' which protrude in the second gap 19 towards the second counter-electrode 17. The bumps 14b' may therefore avoid that, in case of an accidental contact of the membrane electrode 14 with the counter-electrode 16, the membrane electrode 14 completely adheres to the counter-electrode 16 by virtue of electrostatic attraction. By avoiding the complete adherence between the membrane electrode 14 and the counter-electrode 16, the bumps 14b' may be therefore useful in a gap such as gap 19, which does not present springs.

FIGS. 10-14 show manufacturing steps for methods for manufacturing examples of sensors as above (e.g., the sensor 10 of FIG. 1).

At first (FIG. 10), a substrate 24 (which may include a stop layer 28) may be made.

The membrane electrode 14 may be placed or otherwise prepared over the substrate 24 and/or a stop layer 28 (in case the flexible membrane connection 22 comprises the cut or hole 22d as in FIG. 3, the cut or hole 22d may be made or placed before the application of the membrane electrode 14 to the substrate 24 or the stop layer 28, or after having applied the membrane electrode 14 to the substrate 24 or stop layer 28).

Subsequently, cover material 26 (which may be a sacrificial material to be subsequently at least partially removed) may be deposed (FIG. 11) on the substrate 24, e.g., at least in the region which will constitute the gap 18 and/or in peripheral portions of the structure 12. The cover material 26 may be a covering oxide.

At least one hole 26a (e.g., through hole) may be performed, e.g., in selected positions (which will, for example, accommodate the at least one spring 20) of the cover material 26. The at least one hole 26a may be conical or oblique (other shapes may be possible). Multiple holes 26a have preferably sidewall angles which are the same or vary of maximal 1% or 5% from each other, so as to obtain springs 20 with the same or very similar spring constants. The at least one hole 26a may be obtained by etching (e.g., by using dry or wet TEOS etch) or other removing techniques. The at least one hole 26a may at least partially expose the surface 14a on which the at least one spring 20 will abut. The exposed parts of the surface 14a may correspond, for example, to non-conductive islands of the surface 14a: in case the spring will be in conductive and/or highly doped material, the island will permit to insulate the membrane electrode 14 from the counter-electrode 16. The non-conductive islands may be deposed after the generation of the holes 26a, for example.

Figure 12:
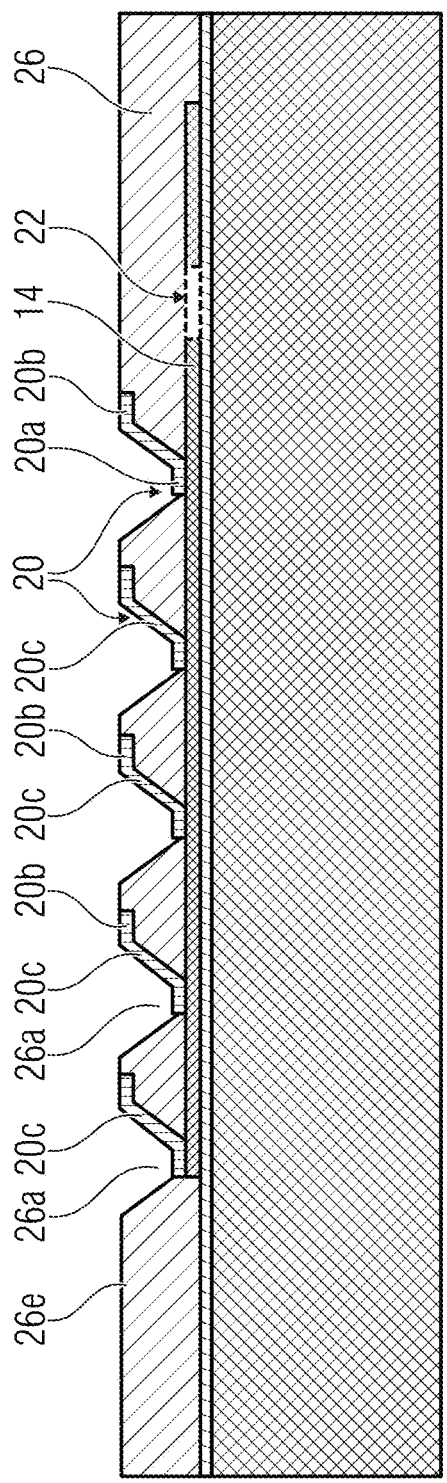

As shown in FIG. 12, at least one spring 20 may be prepared, e.g. by depositing material over the least one hole 26a, and in particular, on the surface(s) of the least one hole 26a. As shown by FIG. 12, a part of the spring 20, adjacent to the membrane electrode 14, will constitute the membrane-side foot 20a of the spring 20. The part of the spring 20, which is on the other side with respect to the foot 20a (and which may protrude in a horizontal direction), will constitute the counter-electrode-side foot 10b of the at least one spring 20. The intermediate part of the spring 20, which elongates obliquely along the borders of the hole 26a, will constitute the main portion 20c of the at least one spring 20.

Figure 13:
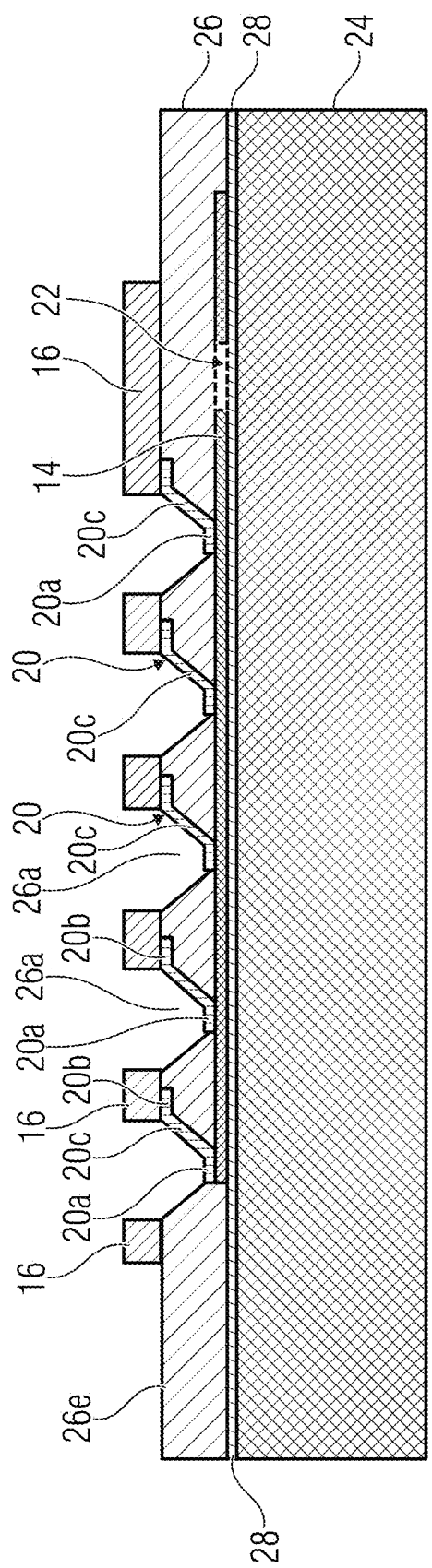

The counter-electrode-side foot 10b (e.g., the upper side of the counter-electrode-side foot 10b in the thickness direction) may be exposed. The upper side of the counter-electrode-side foot 10b and the layer of cover material 26 may therefore result to be levelled with each other in their upper surface 26e in the thickness direction. As shown in FIG. 13, the levelled upper surface 26e will be used for the subsequent step of preparing the mechanical contact of the counter-electrode 16 to the at least one spring 20. In order to better level the upper surface 26e chemical-mechanical polishing may be performed.

In a subsequent step, the counter-electrode 16 may be prepared and/or structured so as to abut on the at least one spring 20, e.g. on the counter-electrode-side foot 10b. Thereafter, remaining region(s) of the cover material 26 (e.g., at least those which occupy the volume which will be taken by the gap 18) may be etched or otherwise removed, to obtain the structure of FIG. 1.

Figure 19:
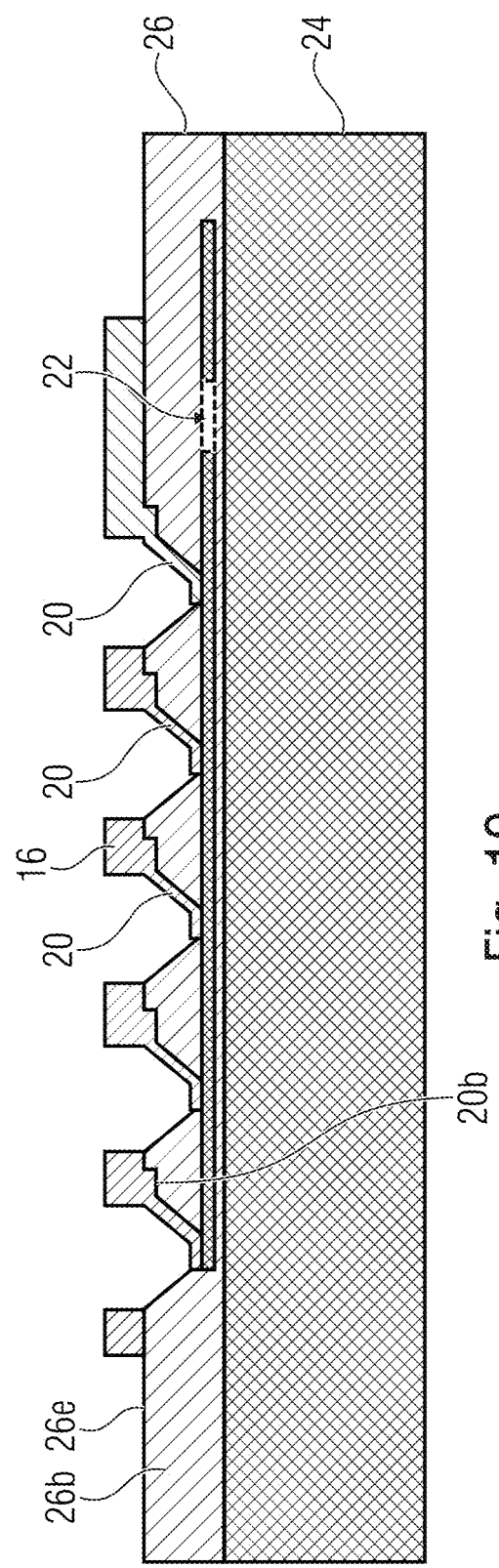
FIG. 19 shows an intermediate step according to a method.

The counter-electrode 16 and the at least one spring 20 may be made in the same material (see FIG. 19).

In methods above and below, the membrane electrode 14 may be a first element and the counter-electrode 16 may be a second element. Hover, the operations may be reversed, so that the first element to be placed over the substrate 24 is the counter-electrode 16, and the membrane electrode 14 is the second element to be placed over the substrate 24.

FIGS. 14-17 show a method for manufacturing a dual counter-electrode sensor like that of FIG. 5.

Figure 14:
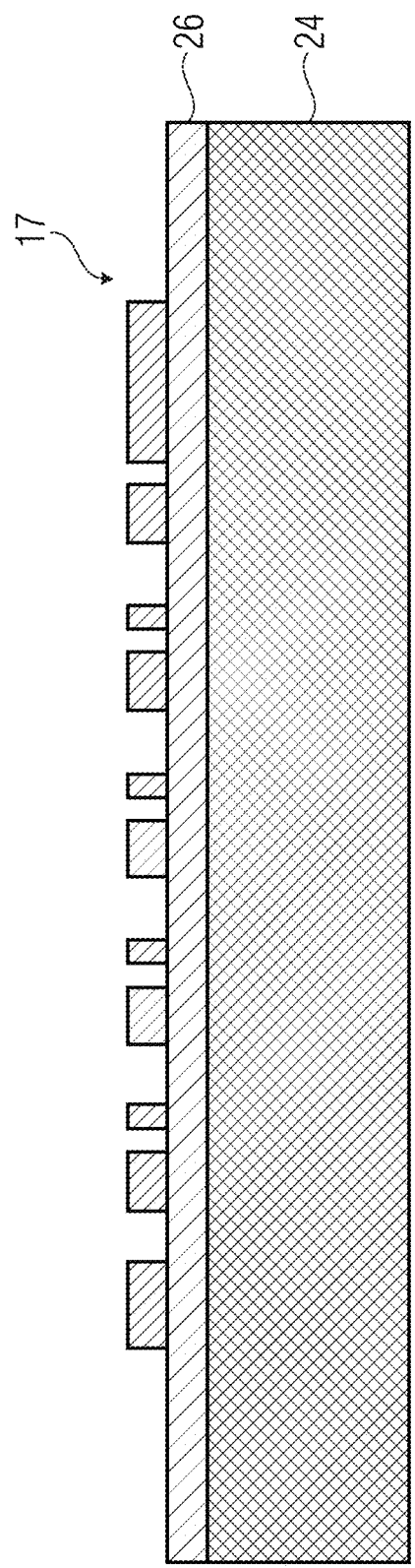

FIG. 14 shows a step in which the second (more internal) counter-electrode 17 is placed over the substrate 24 and/or the cover layer 26.

Figure 15:
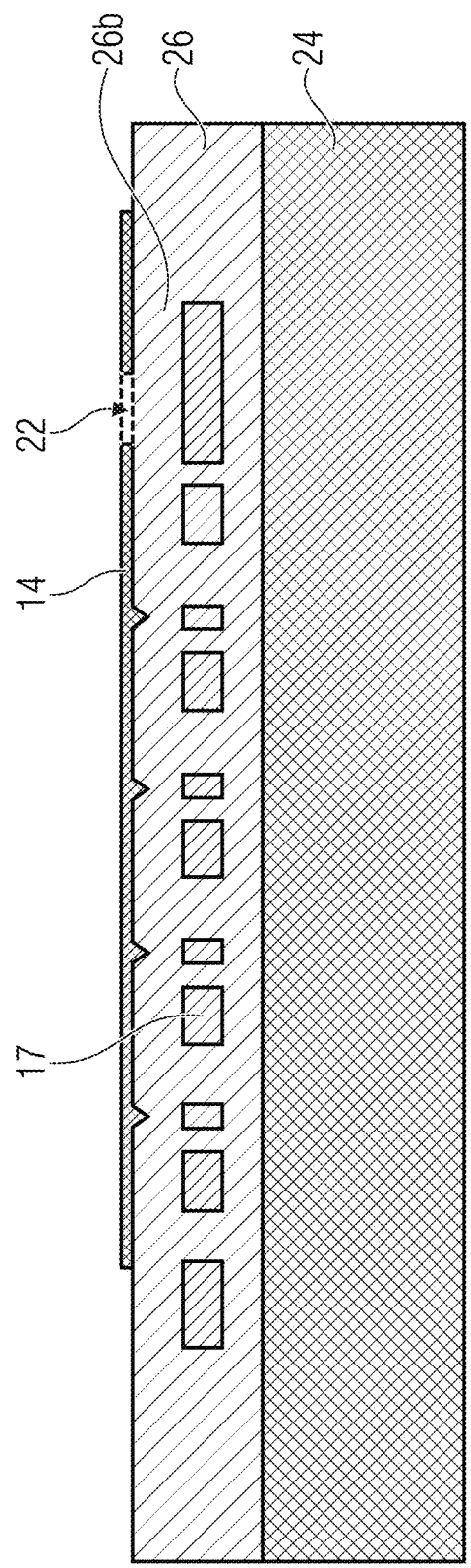

As can be seen in FIG. 15, a second layer of cover material (e.g., covering oxide) 26b may be deposed over the second counter-electrode 17. Thereafter, the membrane electrode 14 may be deposed over the second layer of the cover material 26b.

Figure 16:
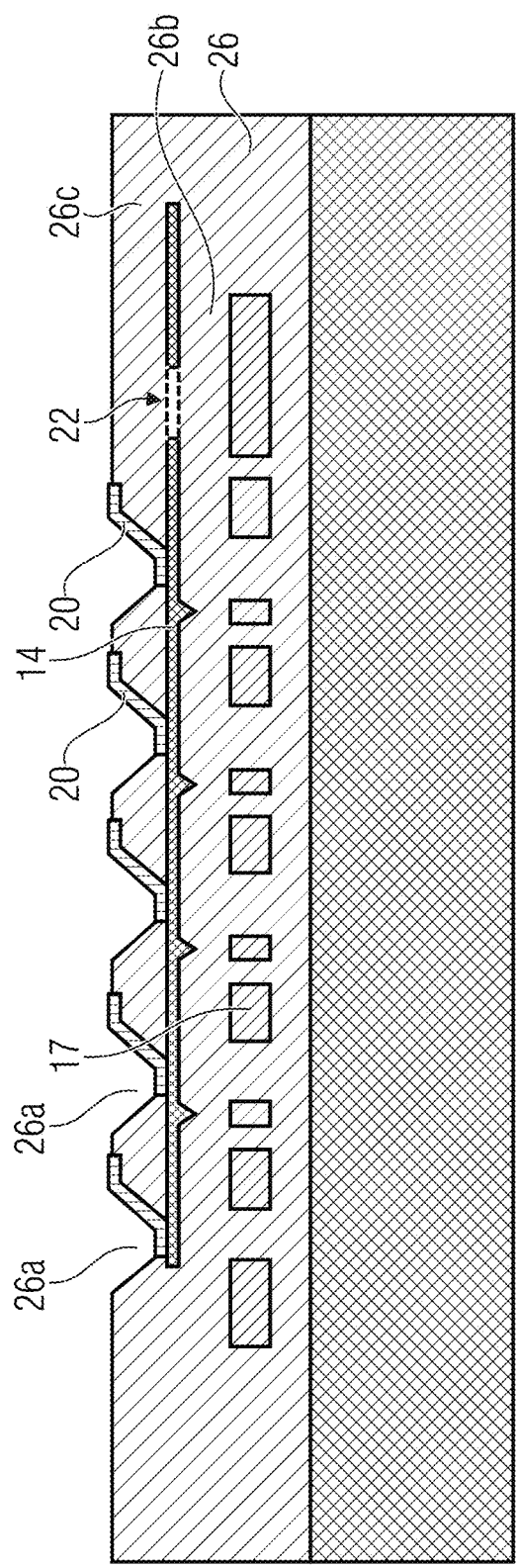

As shown in FIG. 16, a third layer 26c of the cover material (covering oxide) may be placed over the membrane electrode 14. After that, the at least one spring 20 is placed, e.g. after having prepared holes 26a (e.g., conical holes or oblique holes) on the third layer of a cover material 26c.

Figure 17:
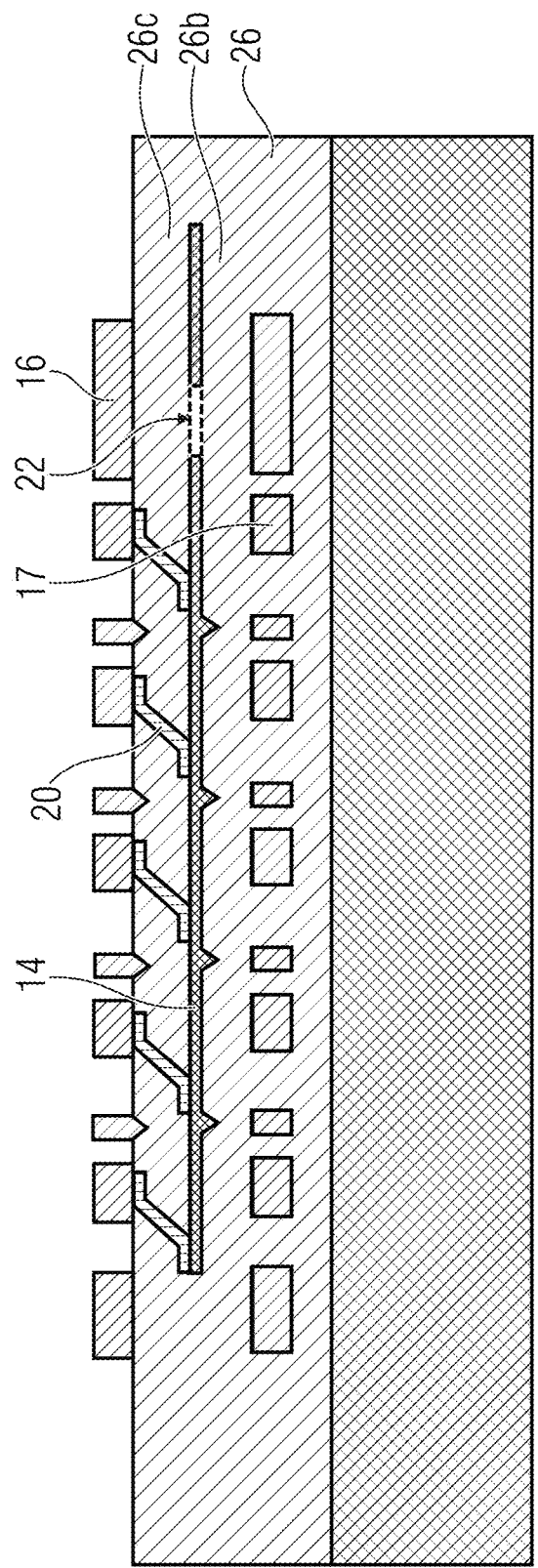

After that, as shown by FIG. 17, the first (more external) counter-electrode 16 may be placed on the at least one spring 20 and on the third layer of the cover material 26c. After that, layers of the cover material 26, 26b and 26c may at least partially be etched or otherwise removed. In case it is intended to make the at least one spring 20 and the first counter-electrode 16 of the same material, an analogous procedure of that of the variant of FIG. 13 may be performed. Basically, when arriving at the step f FIG. 16, any of the passages discussed with reference to FIGS. 12 and 13 may be performed.

When bimorph spring(s) 30 are used, an advantage is obtained in that the bimorph spring(s) 30 will bend away after the cover material 26 has been removed, hence spontaneously increasing the height of the gap 18.

FIG. 18 shows another example with vertical springs 60 in flexible material (e.g., extending in the thickness direction). Here, springs may be obtained by a vertical connection between membrane electrode 14 and the counter-electrode 16.

In order to make the example of FIG. 18, at least one of the following steps may be performed:

1) Etching at least one vertical hole into the cover material 26;

2) Filling the at least one vertical hole with material which is more robust against etch than the cover material, hence creating at least one pillar extending from the membrane electrode 14 in the thickness direction;

3) Etching the remaining cover material (while the at least one pillar, which is more robust against etch, resists against the etchant);

4) Applying the counter-electrode 16 (with the springs 60 attached thereto) to the etched portions, the counter-electrode 16 abutting against the at least one pillar (which therefore acts as a spacer);

5) Etching the at least one pillar (in some cases, the pillar may remain as a part of the counter-electrode 16).

The shape of the spring 60 can vary, but is may be a long, straight cantilever, a ring structure, a spiral structure or any other shape.

Examples of removing material as discussed above may be performed, for at least one of the steps above, by etching (e.g., dry etching or wet etching). Etching may be anisotropic etching or isotropic etching for at least one of the steps above. For at least one of the steps above, TEOS etch may be used.

In order to remove material, at least one of the steps above may comprise a step of chemical mechanical polishing, for example.

When inserting material (e.g., covering material), at least one of the steps above may comprise a lithographic step, e.g. a photolithographic step.

What is claimed is:

1. A sensor comprising:
   a structure;
   a membrane electrode, which is deformable as a consequence of pressure and which is in contact with the structure;
   a first counter-electrode mechanically connected to the structure and separated from the membrane electrode by a first gap;
   at least one spring between the membrane electrode and the counter-electrode so as to exert an elastic force between the membrane electrode and the counter-electrode; and
   a flexible membrane connection mechanically connecting the membrane electrode to the structure.

2. The sensor of claim 1, wherein
   the flexible membrane connection is configured to elastically deform at least as a partial consequence of flexion or movement or deformation of the membrane electrode or of the main part of the membrane electrode.

3. The sensor of claim 2, wherein
   the flexible membrane connection comprises a cut or a hole in correspondence with a portion of the membrane electrode in contact with the structure.

4. The sensor of claim 3, wherein
   the cut or hole of the membrane connection is arched and/or concentric to a rim of the membrane electrode.

5. The sensor of claim 1, wherein
   the flexible membrane connection comprises a spring mechanically connecting the membrane electrode and the structure.

6. The sensor of claim 1, wherein
   the membrane electrode is interposed between the first counter-electrode and a second counter-electrode and is spaced from the first and a second counter-electrodes by the first gap and a second gap, respectively.

7. The sensor of claim 1, wherein
   the at least one spring is a bimorph spring.

8. The sensor of claim 1, wherein
   the membrane electrode is cantilevered to the structure.

9. The sensor of claim 1, wherein
   the at least one spring includes a membrane-side foot abutting on the membrane electrode and a counter-electrode-side foot abutting on the counter-electrode.

10. The sensor of claim 1, wherein
    the at least one spring comprises a plurality of springs.

11. The sensor of claim 10, wherein
    the plurality of springs is an array or matrix of springs.

12. The sensor of claim 1, wherein
    the mechanical connection between the membrane electrode and the structure is stress-free.

13. The sensor of claim 1, wherein
    the membrane electrode presents at least one non-conductive island, the at least one spring abutting on the at least one non-conductive island so that the at least one spring is electrically insulated from the membrane electrode.

14. The sensor of claim 1, wherein
    the at least one spring includes a slanted portion in the first gap.

15. The sensor of claim 1 implemented as a chip or package.

16. A microphone device including a sensor according to claim 1.

17. A method for manufacturing a semiconductor pressure-sensor and/or acoustic sensor, comprising:
    preparing a first element on a substrate, wherein the first element is chosen between a membrane electrode and a counter-electrode;
    preparing at least one spring element to abut on the first element; and
    preparing a second element, so that the at least one spring element abuts on the second element and is elastically connected to the first element and the second element, wherein the second element is chosen between the counter-electrode and the membrane electrode which is not chosen for the first element, wherein
    a spring element material and a first element material or a second element material are the same material.

18. The method of claim 17, further comprising:
    after having prepared the first element, depositing sacrificial material over the first element; and
    preparing the at least one spring element and the second element by:
    removing the sacrificial material in selected positions;
    depositing spring element material over the selected positions;
    depositing second element material over the spring element material; and
    removing remaining sacrificial material.

* * * * *